(12) United States Patent
Bonifield et al.

(10) Patent No.: US 7,960,840 B2
(45) Date of Patent: Jun. 14, 2011

(54) DOUBLE WAFER CARRIER PROCESS FOR CREATING INTEGRATED CIRCUIT DIE WITH THROUGH-SILICON VIAS AND MICRO-ELECTRO-MECHANICAL SYSTEMS PROTECTED BY A HERMETIC CAVITY CREATED AT THE WAFER LEVEL

(75) Inventors: Thomas Dyer Bonifield, Dallas, TX (US); Thomas W. Winter, McKinney, TX (US); William R. Morrison, Dallas, TX (US); Gregory D. Winterton, Flower Mound, TX (US); Asad M. Haider, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 81 days.

(21) Appl. No.: 12/463,830

(22) Filed: May 11, 2009

(65) Prior Publication Data

US 2009/0280602 A1 Nov. 12, 2009

Related U.S. Application Data

(60) Provisional application No. 61/052,517, filed on May 12, 2008.

(51) Int. Cl.
*H01L 23/52* (2006.01)

(52) U.S. Cl. ......... 257/774; 257/E23.145; 257/E23.169; 257/E23.627

(58) Field of Classification Search .......... 438/455–459; 257/774–777, 734, 772, E23.145, E23.169, 257/E21.627
See application file for complete search history.

(56) References Cited

U.S. PATENT DOCUMENTS

| 7,276,799 B2 * | 10/2007 | Lee et al. ...................... 257/777 |
| 2006/0043599 A1 * | 3/2006 | Akram et al. ................. 257/774 |

* cited by examiner

*Primary Examiner* — Brook Kebede
(74) *Attorney, Agent, or Firm* — Yingsheng Tung; Wade J. Brady, III; Frederick J. Telecky, Jr.

(57) ABSTRACT

A TSV-MEMS packaging process is provided. The process includes forming TSVs in the front side of the product wafer, and attaching a first carrier to the front side of the product wafer, subsequent to forming TSVs. The process further includes thinning the back side of the product wafer to expose TSV tips, detaching the first carrier from the front side of the product wafer, and transferring the thinned wafer to a second carrier with back side adhered to the second wafer carrier. Semiconductor components are added to the front side of the product wafer, followed by forming a hermetic cavity over the added semiconductor components, and detaching the second carrier from the back side of the product wafer. Wafer level processing continues after detaching the second carrier.

19 Claims, 4 Drawing Sheets

DOUBLE WAFER CARRIER PROCESS FOR CREATING INTEGRATED CIRCUIT DIE WITH THROUGH-SILICON VIAS AND MICRO-ELECTRO-MECHANICAL SYSTEMS PROTECTED BY A HERMETIC CAVITY CREATED AT THE WAFER LEVEL

This application claims priority from U.S. Provisional Patent Application Ser. No. 61/052,517, filed May 12, 2008, which is hereby incorporated by reference in its entirety.

FIELD

This invention relates generally to a carrier concept for processing a semiconductor device, and more particularly sequentially processing both sides of a product wafer using carriers supporting opposing sides of the product wafer at different times during processing.

BACKGROUND

In the field of semiconductor packaging, it is standard in the industry to process only one side of each of several wafers, and then combine the separately processed wafers together in packaging.

For example, a known MEMS fuel cell uses three substrates in the final product. One substrate is a silicon wafer which has the MEMS device and one substrate is a glass plate which has through silicon vias (TSVs) formed therein. Separate processing of the wafers prior to packaging is common because each die component can require processing steps that have significantly different chemical and temperature parameters. For example, a MEMs wafer is processed differently from a wafer supporting TSVs. Even further, each wafer can have different support requirements during processing due to fragility of certain components and the mentioned processing parameters. Once the separate wafers are processed, they are packaged into various final semiconductor products as known in the art.

BRIEF SUMMARY

Applicants have realized that the current separate processing of wafers prior to packaging can be time consuming, and can prevent further size reduction for certain devices. It is Applicants solution to process both sides of a product wafer, thereby significantly reducing, and even eliminating, a necessity to package multiple and separately processed wafers in a package.

Efforts at processing both sides of a silicon wafer have been contemplated; however, there is a consensus in the art that processing on both sides of a silicon wafer should be avoided. Based upon current known techniques and apparatus for handling product wafers, there is currently no satisfactory way to handle the product wafer and process the product wafer on both sides without damaging the processed side of that wafer.

The Applicants observed, for example in a micro-electromechanical system (MEMS), that a hermetic cavity can be required in wafer form to protect the MEMS devices during subsequent assembly. In addition, through-silicon-vias (TSVs) are desirable with MEMS in a wafer level hermetic cavity because this approach significantly reduces the size of the die with MEMS, reduces the packaged unit size, and improves the interconnect performance. However, the MEMS device and the wafer level hermetic cavity structures have maximum temperature constraints and mechanical support requirements during the TSV process flow which are incompatible with some TSV process flows.

One solution in the art to combine TSVs with MEMS and a hermetic cavity require that the portion of the TSV process flow, which exposes the TSV tips on the backside of the wafer, be done while mechanically contacting the MEMS and the wafer level hermetic cavity materials and structure. However, this mechanical contact has been found to scratch the MEMS cavity materials and can further be incompatible with the mechanical and chemical fragility of the MEMS structure.

Certain process flow sequences must occur in all standard TSV processing and in standard MEMS flow with a wafer lever hermetic cavity. The Applicants have discovered a process for managing and handling a product wafer without damaging a processed side of the wafer, and without disrupting known process flows. The inventive process can utilize and be implemented with all known process flows, for example forming TSVs, forming MEMS, and forming a hermitic cavity over the MEMS structure, all on the same substrate, and without damaging any of the processed components.

In order to overcome the deficiencies of the art, the Applicants have implemented a "two carrier" sequence in which a first carrier supports the wafer during processing, and a second carrier supports the wafer while processing the opposite side. Each of the carriers can be temporarily adhesively bonded to a surface of the wafer while processing the opposite side. For example, a first carrier can be temporarily adhered to a wafer surface having TSVs formed therein. During the temporary adhesion, the back side of the wafer can be thinned to expose the TSV tips. Subsequent to the back side thinning, the wafer can be transferred to a second carrier and temporarily adhesively bonded thereto. In order to avoid damaging the exposed TSV tips, the temporary adhesive layer can be of a thickness to cover the exposed tips while removably bonding the second carrier. During this supporting of the processed wafer from the back side, the front side can be further processed to include MEMS or similar devices thereon. A hermetic cavity can also be formed over the MEMS at this stage. Because the wafer is supported from the back side at the time of MEMS and hermetic cavity formation, there is no need to support or secure the hermitic cavity in a manner which could cause scratching or damage thereto. Upon release of the second carrier, the wafer, now processed on both sides without damaging components, can proceed to any known subsequent processing.

Accordingly, the process flow in this disclosure solves several problems in the art including scratching and damaging a processed side of the wafer and the ability to use by using two wafer carrier process sequences for handling a product wafer having TSVs, MEMS and a hermetic cavity.

It is to be understood that both the foregoing general description and the following detailed description are exemplary and explanatory only and are not restrictive of the invention, as claimed.

BRIEF DESCRIPTION OF THE DRAWINGS

The invention is best understood from the following detailed description when read with the accompanying FIGURES. It is emphasized that in accordance with the standard practice in the semiconductor industry, various features may not be drawn to scale. In fact, the dimensions of various features may be arbitrarily increased or reduced for clarity of discussion. Reference is now made to the following descriptions taken in conjunction with the accompanying drawings, in which.

DETAILED DESCRIPTION

Reference will now be made in detail to the exemplary embodiments of the present disclosure, an example of which is illustrated in the accompanying drawings. Wherever possible, the same reference numbers will be used throughout the drawings to refer to the same or like parts.

In the following description, reference is made to the accompanying drawings that form a part thereof, and in which is shown by way of illustration specific exemplary embodiments which may be practiced. These embodiments are described in sufficient detail to enable those skilled in the art to practice the embodiments and it is to be understood that other embodiments may be utilized and that changes may be made without departing from the scope of the invention. The following description is, therefore, merely exemplary.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

According to embodiments, a packaging process uses first and second carriers to support a product wafer for sequentially processing both sides of the same product wafer.

Figure 1:
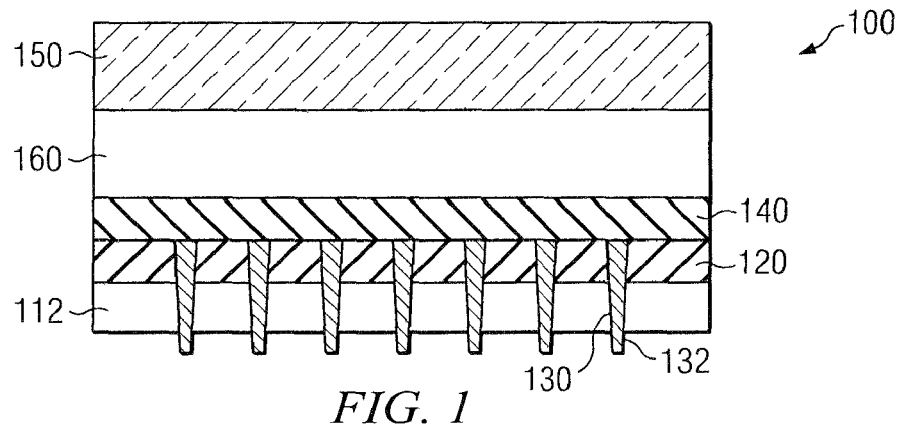
FIG. 1 is a side view depicting an exemplary product wafer according to certain embodiments.

FIG. 1 is a side view depicting a product wafer 100 processed on both sides without damaging components of either side, according to certain embodiments. It should be readily apparent to those skilled in the art that FIG. 1 is exemplary and that other elements can be added, removed or modified without departing from the scope of the exemplary embodiments.

As depicted, the exemplary product wafer 100 can be incorporated into and include various semiconductor devices. The product wafer 100 can include a front side 102 and a back side 104. The back side 104 can include a substrate 110, more particularly, a thinned substrate 112, and exposed tips 132 of through silicon vias 130. The front side 102 can include levels of metal interconnects 120, semiconductor components 140 and a glass lid 150. The front side can also include an interposer 160. While FIG. 1 depicts several components of the product wafer 100, one skilled in the art will realize that the product wafer 100 can include any number and type of components.

The substrate 110 of the product wafer 100 can be formed of a material, using any process, to any dimension and specification, as known in the art. For example, the substrate 110 can be a silicon substrate, including a single or multi-layer substrate.

In addition, the levels of metal interconnects 120 and through silicon vias 130 can be formed of a material and components, using any process, to any dimension and specification, as known in the art. The levels of metal interconnects 120 can include, for example, copper or aluminum. The levels of metal interconnects 120 can include a barrier metal or a seed layer (not shown), as known in the art. It will be further appreciated that any number of through silicon vias 130 can be formed and that the depiction herein is merely exemplary, and not intended to be limiting.

The component layer 140 on the front side 102 of the product wafer 100 can be formed of components, using any process, to any dimension and specification, as known in the art. The component layer 140 can include semiconductor components. The semiconductor components can include MET, POR, DMDs, MEMs, etc. Likewise, the glass lid 150 and interposer 160 can be formed in a manner known in the art to protect the component layer 140.

FIGS. 2A through 2H illustrate formation of an exemplary product wafer 200 (FIG. 2H) according to certain embodiments. It should be readily apparent to those skilled in the art that FIGS. 2A through 2H are exemplary and that other elements and steps can be added, removed or modified without departing from the scope of the exemplary embodiments.

Figure 2A:
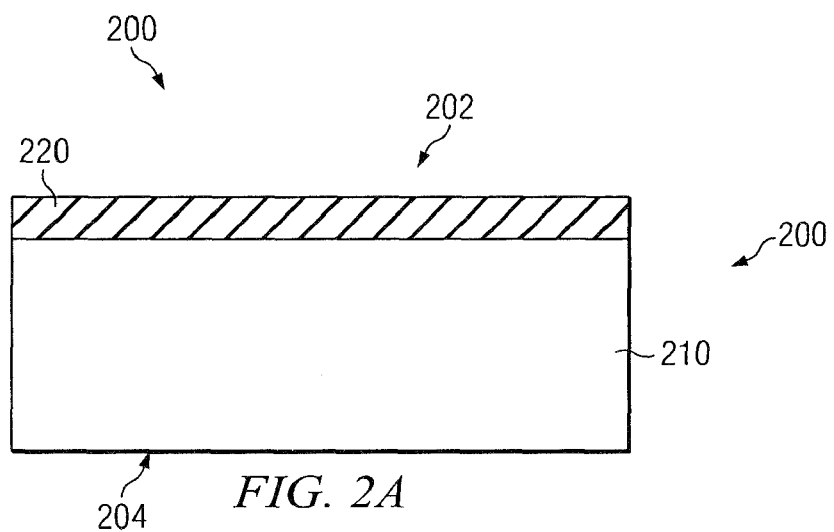
FIGS. 2A through 2H are side views depicting processing stages of an exemplary product wafer according to certain embodiments.

FIG. 2A depicts the exemplary substrate 210 and levels of metal interconnects 220 formed on the substrate 210. The substrate 210 can be a silicon substrate, including a single or multi-layer substrate. The substrate 210 can be a product wafer 200 which can be a silicon product wafer, which will be used to create integrated circuit die with through silicon vias and micro-electromechanical systems protected by a hermetic cavity, created at the wafer level. The substrate 210 can further include the levels of metal interconnects 220 formed on the front side 202 of the substrate. The levels of metal interconnects 220 can include, for example, copper or aluminum. The levels of metal interconnects 220 can include a barrier metal or a seed layer (not shown), as known in the art. Deposition of the metal layers in 220 can be by sputtering, chemical vapor deposition, electroplating, etc. as known.

Figure 2B:
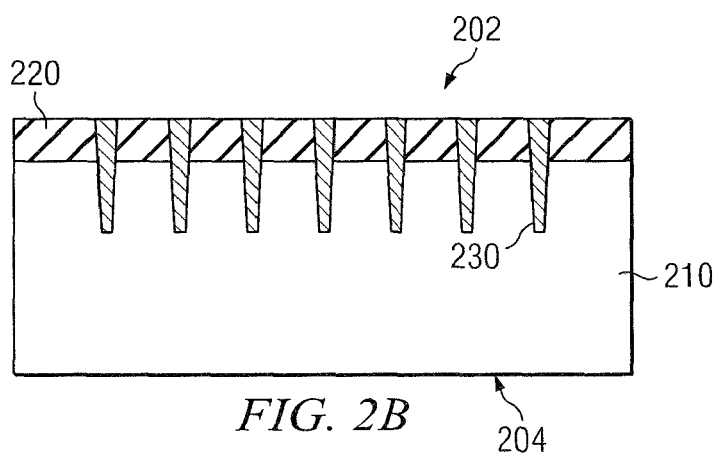

In FIG. 2B, processing of the product wafer 200 can include forming through silicon vias 230. Forming of the through silicon vias 230 can be in a back-end-of-line (BEOL), via-first methodology. In certain embodiments, the formation of levels of metal interconnects 220 and substrate 210 can include etching to form vias of a depth consistent with end product requirements of a semiconductor device. Subsequent to etching, the etched vias can be lined with a dielectric layer to isolate the TSV from the Si substrate, Subsequent to lining with a dielectric layer, the TSV can be filled with conductive material. In certain embodiments, the conductive material can include a barrier metal or a copper seed layer and a copper fill. Filling of the etched vias can be with a bottom-up fill as known in the art. In addition, deposition of the copper of the through silicon vias 230 can be prior to, coincident with, or subsequent to the formation of levels of metal interconnects 220 as known. The front side 202 of the product wafer 200 can be planarized. In certain embodiments, planarization can include chemical mechanical polishing (CMP) or the like to obtain a surface suitable for further processing as will be described further.

Figure 2C:
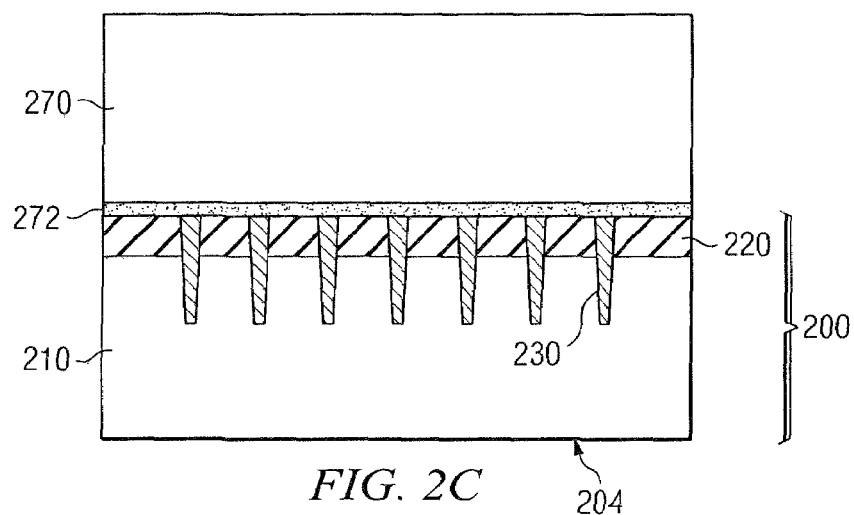

In FIG. 2C, processing of the product wafer 200 can include attaching a first carrier 270 to the product wafer 200. The first carrier 270 can be attached to the front side 202 of the product wafer. Attachment can be by use of a temporary adhesive 272 to secure the first carrier in a manner suitable to enable subsequent processing.

In certain embodiments, the temporary wafer bonding adhesive will offer adequate flow properties, mechanical strength, thermal stability, chemical resistance, and easy debonding and cleaning. The adhesive properties of the temporary bonding adhesive can be voided by one of thermal debonding or chemical debonding.

In certain embodiments, the first carrier 270 can include silicon wafers, glass plates, or stiff polymers. In certain embodiments, the first carrier 270 can be stiff enough to support the thin product wafer in automated processing equipment. Further, the first carrier 270 and temporary adhesive 272 can be of materials which will not degrade when exposed to processing conditions such as temperature and chemicals. The first carrier 270 and temporary adhesive 272 can be removed without degrading the product wafer 200, for example, from high temperature, pressure or chemical exposure. Finally, the first carrier 270 can be attached to the product wafer 200 with wafer bonding equipment. Similarly, first the carrier 270 can be removed in wafer debonding equipment which can transfer the thin silicon product wafer 200 to another carrier or to a dicing tape.

Figure 2D:
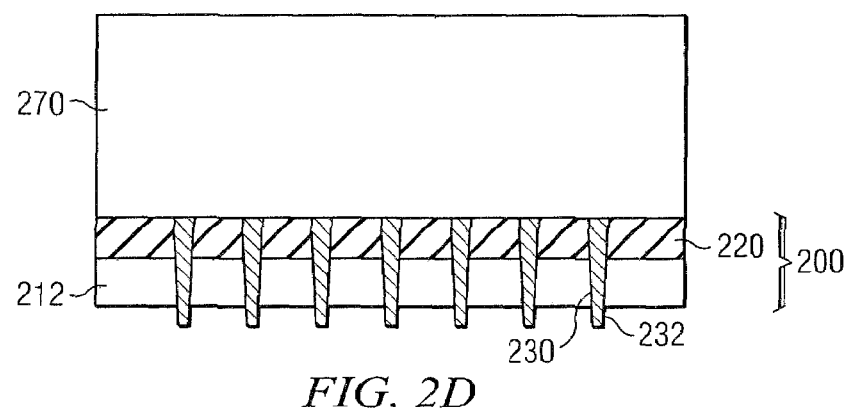

In FIG. 2D, processing of the product wafer 200 can include thinning the back side 204 of the product wafer 200, resulting in thinned substrate 212. Thinning of the substrate 210 to form the thinned substrate 212 can be by any known process to expose tips 232 of the through silicon vias 230. In certain embodiments, thinning of the substrate 210 can include backgrinding, CMP, and/or etching of the silicon substrate on the back side 204 thereof.

Figure 2E:
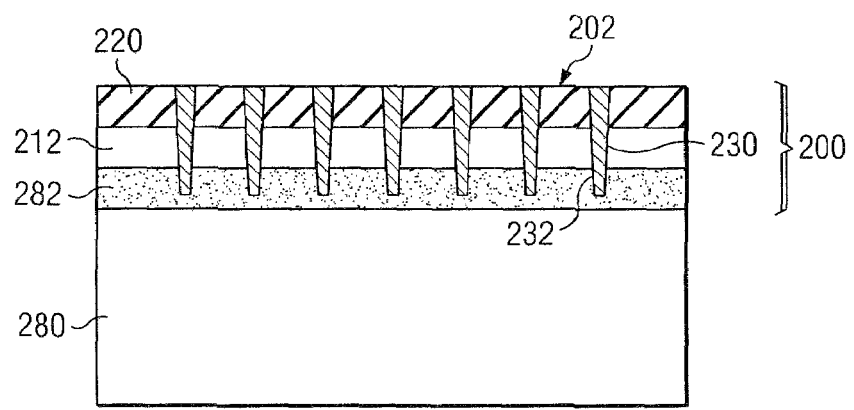

In FIG. 2E, processing of the product wafer 200 can include transferring of the product wafer 200 to a second carrier 280. Transferring can include detaching of the first carrier 270 from the product wafer 200. In certain embodiments, detaching can include debonding of the temporary adhesive between the first carrier 270 and the product wafer 200. Debonding can include chemical or thermal debonding as known in the art, and according to properties of the temporary adhesive. Subsequent to debonding, the product wafer 200 can be attached to the second carrier 280. The second carrier 280 can be attached to the back side 204 of the product wafer 200. The back side 204 of the product wafer 200 is the side with the TSV tips 232 exposed and any other back side interconnects that may be created along with the TSV tips 232 on the back side 204 of the product wafer 200. Attachment of the second carrier 280 to the back side 204 of the product wafer 200 can be by bonding, and further by temporary adhesive bonding 282. The temporary adhesive bonding 282 can secure the second carrier 280 to the back side 204 of the product wafer 200 in a manner suitable to enable subsequent processing of the product wafer 200. The temporary adhesive bonding 282 can be of a thickness to cover the TSV tips 232 on the back side 204 of the product wafer 200. It will be appreciated that a thickness of the adhesive 282 can protect the TSV tips 232 during the subsequent processing and prevent the second carrier 280 from damaging the TSV tips or product wafer.

In certain embodiments, the temporary wafer bonding adhesive will offer adequate flow properties, mechanical strength, thermal stability, chemical resistance, and easy debonding and cleaning. The adhesive properties of the temporary bonding adhesive can be voided by one of thermal debonding or chemical debonding.

In certain embodiments, the second carrier 280 can include silicon wafers, glass plates, or stiff polymers. In certain embodiments, the second carrier 280 can be stiff enough to support the thin product wafer in automated processing equipment. Further, the second carrier 280 and temporary adhesives can be of materials which will not degrade when exposed to processing conditions such as temperature and chemicals. The second carrier 280 and temporary adhesive can be removed without degrading the product wafer 200, for example, from high temperature, pressure or chemical exposure. Finally, the second carrier 280 can be attached to the product wafer 200 with wafer bonding equipment. Similarly, the second carrier 280 can be removed in wafer debonding equipment which can transfer the thin silicon product wafer 200 to another carrier or to a dicing tape.

Figure 2F:
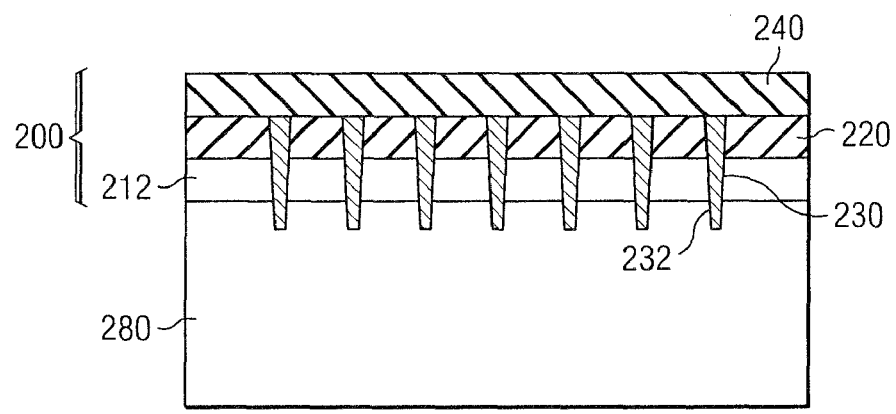

In FIG. 2F, processing of the product wafer 200 can include adding components 240 to the levels of metal interconnects 220 on the front side 202 of the product wafer 200.

In certain embodiments, the added components 240 can include semiconductor components. Because the second carrier 280 is attached to the back side 203 of the thinned substrate 212, the product wafer 200 can be processed through, for example a MEMs process flow, without exposing the front side 202 to a carrier adhesive. Accordingly, the second carrier 280 can support the thin product wafer 200 with the TSV tips 232 exposed while completing the MEMs process flow.

In certain embodiments, the process flow at FIG. 2F can include adding metals, POR, digital micro-mirror devices (DMDs) as well as the described MEMs. The component additions are not intended to limit the scope of exemplary embodiments and are instead provided by way of illustration.

Figure 2G:
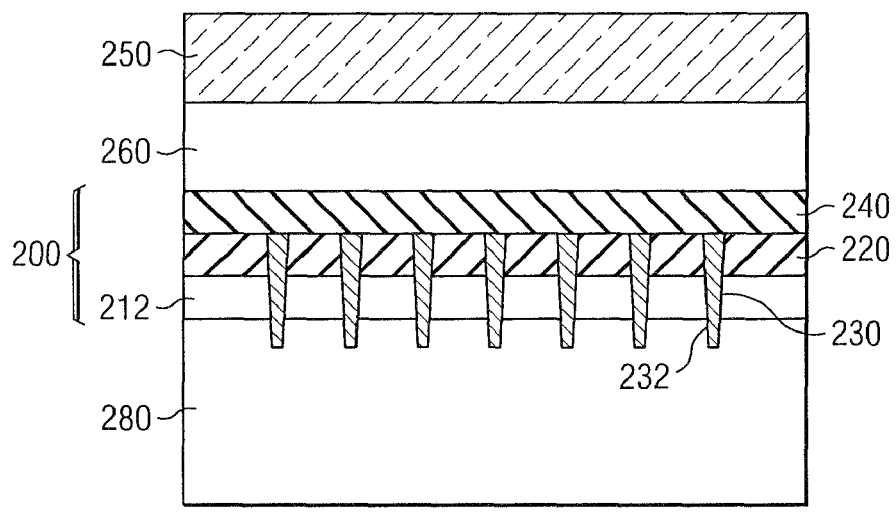

In FIG. 2G, processing of the product wafer 200 can include attaching a hermetic lid 250 to the front side 204 of the product wafer 200. Attaching the lid 250 can include forming an interposer 260 between the lid 250 and the front side 204 of the product wafer 200.

Each of the lid 250 and interposer 260 can be formed of components, using any process, to any dimension and specification, as known in the art. In certain embodiments, the lid 250 can be a glass lid or other hermetic cavity suitable to protect the MEMS devices during subsequent assembly. In certain embodiments, the interposer 260 can include an electrical interface routing between connections (not shown).

Figure 2H:
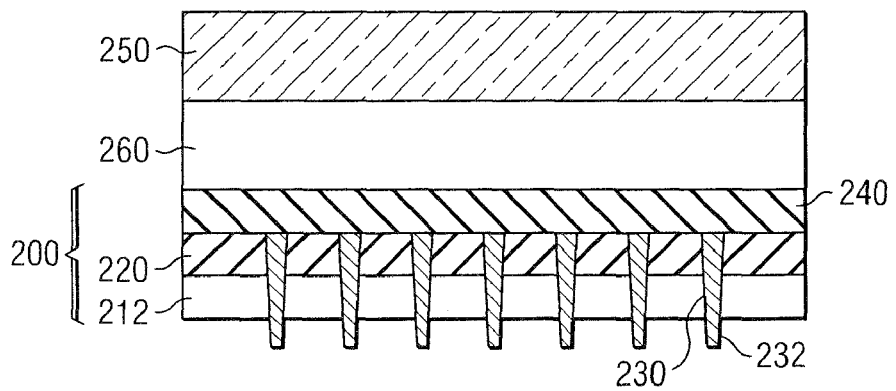

In FIG. 2H, processing of the product wafer 200 can include detaching the second carrier 280 from the back side 204 of the thinned substrate 212.

In certain embodiments, detaching can include debonding of the temporary adhesive between the second carrier 280 and the back side 204 of the product wafer 200. Debonding can include chemical or thermal debonding as known in the art, and according to properties of the temporary adhesive.

Upon detaching the second carrier 280 from the back side 204 of the thinned product wafer 200, the product wafer 200 with MEMS and hermetic cavities is transferred to a dicing tape for dicing into separate die. After dicing, a wafer-level chip-scale package assembly process flow and materials (WLCSP) can be used to attach solder balls to the back of the MEMS die for later assembly on to a circuit board or package substrate (not shown).

Figure 3:
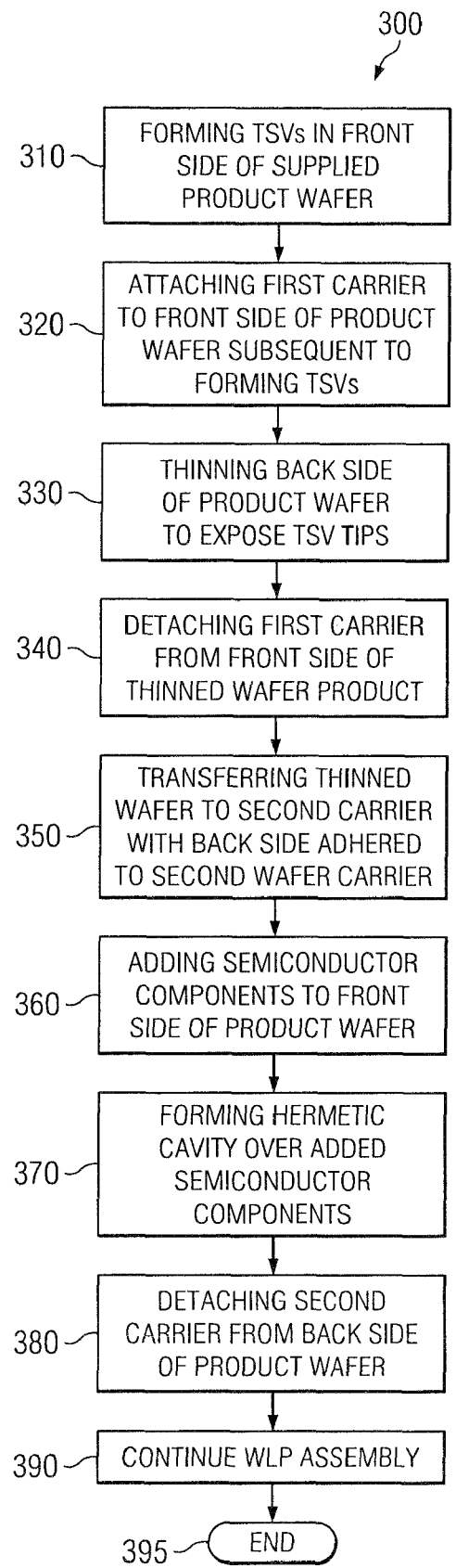
FIG. 3 is a flow diagram depicting an exemplary method of forming an exemplary product wafer according to certain embodiments.

FIG. 3 is a flow diagram illustrating a method 400 of processing a product wafer, consistent with embodiments of the present disclosure. In exemplary embodiments, the product wafer can include wafer level processing of the product wafer. It should be readily apparent to those skilled in the art that FIG. 3 is exemplary and that other steps can be added or existing steps can be removed or modified without departing from the scope of the exemplary embodiments.

Method 300 begins at 310 with forming TSVs in a front side of a supplied product wafer. The product wafer can include a substrate, for example a silicon substrate, including a single or multi-layer substrate. Levels of metal interconnects can be formed on the substrate as is known. The TSVs can be formed through or prior to the formation of levels of metal interconnects. The TSVs can include copper TSVs.

In 320, the method can include attaching a first carrier to the front side of the product wafer subsequent to forming the TSVs. Attachment can be by use of a temporary adhesive to secure the first carrier in a manner suitable to enable subsequent processing. In certain embodiments, the temporary wafer bonding adhesive will offer adequate flow properties, mechanical strength, thermal stability, chemical resistance, and easy debonding and cleaning. The adhesive properties of the temporary bonding adhesive can be voided by one of thermal debonding or chemical debonding.

The first carrier can include silicon wafers, glass plates, or stiff polymers. In certain embodiments, the first carrier can be stiff enough to support the thin product wafer in automated processing equipment. Further, the first carrier and temporary adhesive can be of materials which will not degrade when exposed to processing conditions such as temperature and chemicals The first carrier and temporary adhesive can be removed without degrading the product wafer, for example, from high temperature, pressure or chemical exposure. Finally, the first carrier can be attached to the product wafer with wafer bonding equipment. Similarly, the first carrier can be removed in wafer debonding equipment which can transfer the thin silicon product wafer to another carrier or to a dicing tape.

In 330, the method can include thinning a back side of the product wafer to expose TSV tips. Thinning of the substrate to form the thinned substrate can be by any known process to expose tips of the through silicon vias. In certain embodiments, thinning of the substrate can include backgrinding, CMP, and/or etching of the silicon substrate on the back side thereof.

In 340, the method can include detaching the first carrier from the front side of the thinned product wafer. In certain embodiments, detaching can include debonding of the temporary adhesive between the first carrier and the product wafer. Debonding can include chemical or thermal debonding as known in the art, and according to properties of the temporary adhesive.

In 350, the method can include transferring the thinned wafer to the second carrier with the back side of the wafer adhered to the second carrier. Subsequent to debonding, the product wafer can be attached to the second carrier. The second carrier can be attached to the back side of the product wafer. The back side of the product wafer is the side with the TSV tips exposed and any other back side interconnects that may be created along with the TSV tips on the back side of the product wafer. Attachment of the second carrier to the back side of the product wafer can be by bonding, and further by temporary adhesive bonding. The temporary adhesive bonding can secure the second carrier to the back side of the product wafer in a manner suitable to enable subsequent processing of the product wafer.

In certain embodiments, the temporary wafer bonding adhesive will offer adequate flow properties, mechanical strength, thermal stability, chemical resistance, and easy debonding and cleaning. The adhesive properties of the temporary bonding adhesive can be voided by one of thermal debonding or chemical debonding.

In certain embodiments, the second carrier can include silicon wafers, glass plates, or stiff polymers. In certain embodiments, the second carrier can be stiff enough to support the thin product wafer in automated processing equipment. Further, the second carrier and temporary adhesives can be of materials which will not degrade when exposed to processing conditions such as temperature and chemicals.

The second carrier and temporary adhesive can be removed without degrading the product wafer, for example, from high temperature, pressure or chemical exposure. Finally, the second carrier can be attached to the product wafer with wafer bonding equipment. Similarly, the second carrier can be removed in wafer debonding equipment which can transfer the thin silicon product wafer to another carrier or to a dicing tape.

In 360, the method can include adding semiconductor components to the front side of the product wafer. Because the second carrier is attached to the back side of the thinned substrate, the product wafer can be processed through, for example a MEMs process flow, without exposing the front side to a carrier adhesive. Accordingly, the second carrier can support the thin product wafer with the TSV tips exposed while completing the MEMs process flow. In certain embodiments, the added components can include metals, POR, digital micro-mirror devices (DMDs) and MEMs.

In 370, the method can include forming a protective layer, such as a hermetic cavity, over the added semiconductor components. The hermetic cavity can be attached to the front side of the product wafer. Attaching the hermetic cavity can include forming an interposer between the hermetic cavity and the front side of the product wafer. Each of the hermetic cavity and interposer can be formed of components, using any process, to any dimension and specification, as known in the art. In certain embodiments, the hermetic cavity can be a glass lid or other hermetic cavity suitable to protect the MEMS devices during subsequent assembly. In certain embodiments, the interposer can include an electrical interface routing between connections (not shown).

In 380, the method can include detaching the second carrier from the back side of the product wafer. In certain embodiments, detaching can include debonding of the temporary adhesive between the second carrier and the back side of the product wafer. Debonding can include chemical or thermal debonding as known in the art, and according to properties of the temporary adhesive.

In 390, the method can include continuing wafer level product assembly. Upon detaching the second carrier from the back side of the thinned product wafer, the product wafer with MEMS and hermetic cavities is transferred to a dicing tape for dicing into separate die. After dicing, a wafer-level chip-scale package assembly process flow and materials (WLCSP) can be used to attach solder balls to the back of the MEMS die for later assembly on to a circuit board or package substrate (not shown).

In 395, the method can end, but the method can return to any point and repeat.

Thus, the exemplary embodiments promote numerous technical advantages, including but not limited to improved package strength, resilience, longevity, manufacturability, and reliability. This solution uses process flow sequences which will be available in a standard TSV process flow and in a standard MEMS flow with wafer level hermetic cavity. This solution minimizes the new process steps required and protects the MEMS and cavity structure better than other approaches to combine TSVs with MEMS and a cavity in a wafer level process. The process can be used to form any number of products, including DLPS, heater chips, and future MEMS products such as accelerometers, pressure sensors, and low mass thermal sensors.

While the invention has been described with reference to the exemplary embodiments thereof, those skilled in the art will be able to make various modifications to the described embodiments without departing from the true spirit and scope. The terms and descriptions used herein are set forth by way of illustration and are not meant as limitations. In particular, although the method has been described by examples, the steps of the method may be performed in a different order than illustrated or simultaneously. Furthermore, to the extent that the terms "including", "includes", "having", "has", "with", or variants thereof are used in either the detailed description and the claims, such terms are intended to be inclusive in a manner similar to the term "comprising".

Other embodiments of the present disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor packaging process comprising:
   attaching a first carrier to the front side of a product wafer, the front side of the product wafer comprising through silicon vias (TSVs);
   thinning a back side of the attached product wafer to expose TSV tips;
   transferring the thinned product wafer to a second carrier with the back side of the thinned product wafer adhered to the second carrier; and
   forming semiconductor components to the front side of the transferred and thinned product wafer.

2. The process of claim 1, further forming a hermetic cavity over the semiconductor components; and detaching the second carrier from the back side of the product wafer.

3. The process of claim 2, further continuing wafer level processing.

4. The process of claim 1, wherein attaching comprises temporary adhesive bonding.

5. The process of claim 1, wherein detaching comprises adhesive debonding.

6. The process of claim 1, wherein the first and second carriers comprise distinct carriers.

7. The process of claim 1, wherein each of the first and second carriers comprise a glass carrier.

8. The process of claim 1, wherein each of the carriers comprise a flexible substrate.

9. The process of claim 1, wherein each of the carriers comprise a web.

10. The process of claim 1, wherein each the carriers comprise silicon wafers.

11. The process of claim 1, wherein each of the carriers comprise stiff polymers.

12. The process of claim 1, wherein components on a first surface of the product wafer comprise metals, protective overcoat (POR), digital mircromirror devices (DMDs), micro-electromechanical systems (MEMs), etc.

13. The process of claim 2, wherein the hermetic cavity comprises a glass lid and an interposer.

14. A semiconductor packaging process comprising:
    attaching a first carrier to a first side of a product wafer during processing of a second side of the product wafer;
    detaching the first carrier;
    attaching a second carrier to the second side of the same product wafer for processing of the first side of the product wafer; and
    detaching the second carrier.

15. The process of claim 14, further comprising completing wafer level packaging.

16. The process of claim 14, wherein attaching comprises temporary adhesive bonding and detaching comprises adhesive debonding.

17. The process of claim 14, wherein the first and second carriers comprise distinct carriers.

18. The process of claim 14, wherein each of the first and second carriers comprise one of a glass carrier, a flexible substrate a web, silicon wafers, or stiff polymers.

19. The process of claim 14, wherein components on a first surface of the product wafer comprise metals, protective overcoat (POR), digital mircromirror devices (DMDs), micro-electromechanical systems (MEMs), etc.

* * * * *